United States Patent
Zhang et al.

(10) Patent No.: US 11,156,668 B2
(45) Date of Patent: Oct. 26, 2021

(54) METHOD FOR ITERATIVELY IDENTIFYING PARAMETERS OF EQUIVALENT CIRCUIT MODEL OF BATTERY

(71) Applicant: SHANDONG UNIVERSITY, Shandong (CN)

(72) Inventors: Chenghui Zhang, Jinan (CN); Zhongkai Zhou, Jinan (CN); Bin Duan, Jinan (CN); Yunlong Shang, Jinan (CN); Yan Li, Jinan (CN); Naxin Cui, Jinan (CN)

(73) Assignee: SHANDONG UNIVERSITY, Jinan (CN)

( * ) Notice: Subject to any disclaimer, the term of this patent is extended or adjusted under 35 U.S.C. 154(b) by 0 days.

(21) Appl. No.: 16/644,329

(22) PCT Filed: Nov. 1, 2017

(86) PCT No.: PCT/CN2017/108919
§ 371 (c)(1),
(2) Date: Mar. 4, 2020

(87) PCT Pub. No.: WO2019/051956
PCT Pub. Date: Mar. 21, 2019

(65) Prior Publication Data
US 2020/0209316 A1 Jul. 2, 2020

(30) Foreign Application Priority Data
Sep. 13, 2017 (CN) .......................... 201710823675.X

(51) Int. Cl.
*G01R 31/367* (2019.01)
*G01R 31/36* (2020.01)

(52) U.S. Cl.
CPC ....... *G01R 31/367* (2019.01); *G01R 31/3648* (2013.01)

(58) Field of Classification Search
CPC .................................................... G01R 31/367
(Continued)

(56) References Cited

U.S. PATENT DOCUMENTS

| | | | | |
|---|---|---|---|---|
| 2008/0054848 | A1* | 3/2008 | Yun | G01R 31/367 320/134 |
| 2015/0051853 | A1* | 2/2015 | Baba | G01R 31/367 702/63 |

(Continued)

FOREIGN PATENT DOCUMENTS

| | | |
|---|---|---|
| CN | 103293485 A | 9/2013 |
| CN | 103472397 A | 12/2013 |

(Continued)

OTHER PUBLICATIONS

Jun. 5, 2018 Search Report issued in International Patent Application No. PCT/CN2017/108919.

(Continued)

*Primary Examiner* — Ricky Go
(74) *Attorney, Agent, or Firm* — Oliff PLC

(57) ABSTRACT

A new method for iteratively identifying parameters of an equivalent circuit model of battery, including the steps of: Firstly, dividing the model parameters into two parts, and the parameters in the first part are set to initial values, and the ones in the second part are identified with a least square method. Secondly, determining whether the obtained values of the second part meet the requirements of the equivalent circuit model of battery. If the requirements are not met, the parameters that do not meet the requirements in the second part are set to zeros. Then, the parameters in the first part are identified with the least square method. Otherwise, the ones in the first part are directly identified with the same method. Terminating the iteration process until all the parameters meet the requirements.

5 Claims, 1 Drawing Sheet

(58) Field of Classification Search
USPC .......................................................... 702/57
See application file for complete search history.

(56) References Cited

U.S. PATENT DOCUMENTS

| | | |
|---|---|---|
| 2016/0202324 A1 | 7/2016 | Biletska et al. |
| 2017/0234934 A1 | 8/2017 | Zhong et al. |
| 2017/0288414 A1* | 10/2017 | Klein ...................... B60L 58/16 |
| 2018/0045788 A1* | 2/2018 | Kawai ................. H01M 10/482 |
| 2018/0267089 A1* | 9/2018 | Clauvelin .............. G01R 27/18 |
| 2019/0036356 A1* | 1/2019 | Subbaraman ......... H02J 7/0021 |

FOREIGN PATENT DOCUMENTS

| | | |
|---|---|---|
| CN | 103927440 A | 7/2014 |
| CN | 104422893 A | 3/2015 |
| CN | 105093128 A | 11/2015 |
| CN | 105334462 A | 2/2016 |
| CN | 105548896 A | 5/2016 |
| CN | 105738829 A | 7/2016 |
| CN | 106249171 A | 12/2016 |
| EP | 1 465 035 A3 | 4/2005 |
| JP | 2012-026749 A | 2/2012 |
| WO | 2016/138959 A1 | 9/2016 |

OTHER PUBLICATIONS

Jun. 5, 2018 Written Opinion of the International Searching Authority issued in International Patent Application No. PCT/CN2017/108919.

Feb. 28, 2019 Office Action issued in Chinese Patent Application No. 201710823675.X.

* cited by examiner

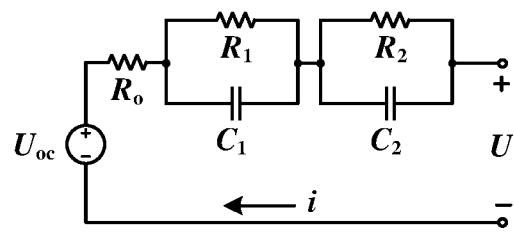

METHOD FOR ITERATIVELY IDENTIFYING PARAMETERS OF EQUIVALENT CIRCUIT MODEL OF BATTERY

FIELD OF THE INVENTION

The present invention relates to the technical field of power batteries, in particular to a new method for iteratively identifying parameters of an equivalent circuit model of a battery.

BACKGROUND OF THE INVENTION

Unlike a conventional fuel vehicle, the states of battery pack, such as state of charge (SOC), state of power (SOP) and state of health (SOH), need be estimated in real time in electric vehicle. These states cannot be directly measured but need to be estimated based on an accurate battery model. Their accuracy is closely related to the safe operation of electric vehicle. Therefore, it has been the focus and difficulty of academic and industrial research to obtain an accurate battery model in recent years. Equivalent circuit models have been widely used owing to their simple structure, small amount of calculation, and high model precision. However, the model parameters are identified by the conventional method using only current and voltage date in a constant current period or voltage data in a standing period, so that the battery model cannot meet the requirements of complex operating conditions and has low precision. In addition, the identification on model parameters seeks for a smallest error between battery output and model output, which easily causes the obtained parameters not to meet the requirements of an actual model, for example, the identified capacitance and resistance values are negative, which is contrary to the physical characteristics of the model parameters.

SUMMARY OF THE INVENTION

The present invention proposes a parameter identification method that is performed by a matrix arithmetic processor, which can iteratively identify parameters of battery model based on the least square theory.

Moreover, the negative capacitance and resistance values can be avoided by setting model parameter ranges during the identification process.

In order to achieve the above objectives, the present invention adopts the following technical solution:

A new method for iteratively identifying parameters of an equivalent circuit model of battery, including:

(1) dividing battery model parameters into a first part and a second part;

(2) setting initial values for the first part, and identifying the second part with a least square method;

(3) determining whether the obtained values of the second part meet the requirements of the equivalent circuit model of battery (for example, the obtained resistance R and capacitance C should be positive and the ranges of the parameters can be adjusted appropriately according to experience value). If the requirements are not met, the parameters that do not meet the requirements in the second part are set to zeros, so that all the parameters in the second part are known at this time. Then, the parameters in the first part are identified with the least square method, and going to step (4).

If the requirements are met, the parameters in the first part are directly identified with the least square method, and going to step (4);

(4) determining whether the obtained values of the first part meet the requirements of the equivalent circuit model of battery (the same requirements as above). If the requirements are not met, the parameters that do not meet the requirements in the first part are set to zeros, and going to step (5);

If the requirements are met, going to step (5);

(5) terminating the iterative identification process if the parameters in the first and the second parts meet the requirements. Otherwise, returning to step (2) to continue the iterative calculation.

Further, a process equation of the equivalent circuit model of battery is assumed as:

$$y = \psi\theta + n$$

where y is a system output of the equivalent circuit model, $\psi$ is an input data matrix, $\theta$ is a parameter vector of the equivalent circuit model, and n is interference noise. $\theta$ is divided into two parts $\theta_1$ and $\theta_2$.

Further, $\psi$ is initialized to $\theta$. Further, $\theta_1$ is initialized to $\theta_{10}$, and $\theta_2$ is identified by the least square method as follows:

$$\theta_2 = (\psi^T\psi)^{-1}\psi^T(y - \psi\theta_{10})$$

Subsequently, the parameters in the first part are identified by the least square method as follows:

$$\theta_1 = (\psi^T\psi)^{-1}\psi^T(y - \psi\theta_2)$$

Further, the parameters related to the voltage in the equivalent circuit model of the power battery are classified as one class, and the parameters related to the current are classified as the other class.

The beneficial effects of the present invention:

(1) The model parameters can be identified under complex operating conditions. Therefore, the adaptability of the battery model is improved.

(2) The parameter ranges can be set in the identification process, and the negative capacitance and resistance values can be avoided.

BRIEF DESCRIPTION OF THE DRAWING

FIG. 1 shows a second-order RC equivalent circuit model.

DETAILED DESCRIPTION OF EMBODIMENTS

The present invention will be further introduced with reference to the drawing and specific examples.

The present invention discloses a new method for iteratively identifying parameters of an equivalent circuit model of battery, including:

Firstly, dividing the model parameters into a first part and a second part, and the parameters in the first part are set to initial values, and the values in the second part is identified by using a least square method. Secondly, determining whether the obtained values of the second part meet the requirements of the equivalent circuit model of battery. If the requirements are not met, the parameters that do not meet the requirements in the second part are set to zeros. Then, the parameters in the first part are identified with the least square method. Otherwise, the ones in the first part are directly identified by using the same method. Terminating the iteration process until all the parameters meet the requirements.

The implementation steps of the method are described in detail as follows:

It is assumed that a process equation of the equivalent circuit model of battery may be written as:

$$y = \psi\theta + n \quad (1)$$

Where y is a system output, $\psi$ is an input data matrix, $\theta$ is a parameter vector to be identified, and n is interference noise. The parameter $\theta$ is divided into two parts $\theta_1$ and $\theta_2$, and the equation (1) may be written as:

$$y - \psi\theta_1 = \psi\theta_2 + n \quad (2)$$

As a preferred embodiment, when the model parameters are divided, the parameters related to the voltage are classified as one part, and the parameters related to the current are classified as the other part; however, there are no special requirements for the specific implementation, and the parameters can be divided according to actual needs.

Step 1: $\theta_1$ is initialized to $\theta_{10}$, and $\theta_2$ is identified by the least square method as follows:

$$\theta_2 = (\psi^T\psi)^{-1}\psi^T(y - \psi\theta_{10}) \quad (3)$$

Step 2: whether $\theta_2$ meets the requirements is determined; if the requirements are not met, the parameters that do not meet the requirements in $\theta_2$ are set to zeros; then, the parameter $\theta_2$ is identified by using the known $\theta_2$.

$$\theta_1 = (\psi^T\psi)^{-1}\psi^T(y - \psi\theta_2) \quad (4)$$

Step 3: similarly, whether $\theta_1$ meets the requirements is determined; if the requirements are not met, the parameters that do not meet the requirements in $\theta_1$ are set to zeros; otherwise, the obtained $\theta_1$ is used as the initial value, Step 1 is performed again, and the iteration process is terminated until both $\theta_1$ and $\theta_2$ meet the requirements.

The present invention is described by using a second-order RC equivalent circuit model as follows:

FIG. 1 shows the second-order RC equivalent circuit model, where $U_{oc}$ represents an open-circuit voltage of a battery; $R_0$ represents a direct-current internal resistance of battery; $R_1$ and $C_1$ represent an electrochemical polarization process during the charging and discharging process of battery; $R_2$ and $C_2$ represent a concentration polarization process during the charging and discharging process of battery; U represents a terminal voltage of battery; the current direction i in the figure indicates the battery is discharged, and it is specified that the current is positive during discharging and negative during charging.

A transfer function of the second-order equivalent circuit model may be expressed as:

$$G(s) = \frac{U_{ocv}(s) - U(s)}{I(s)} = \quad (5)$$

$$\frac{V(s)}{I(s)} = R_0 + \frac{R_1}{1 + R_1 C_1 s} + \frac{R_2}{1 + R_2 C_2 s} = \frac{b_0 s^2 + b_1 s + b_2}{s^2 + a_1 s + a_2}$$

The above equation is discretized as:

$$G(z) = \frac{V(z)}{I(z)} = \frac{b_0' z^2 + b_1' z + b_2'}{z^2 + a_1' z + a_2'} = \frac{b_0' + b_1' z^{-1} + b_2' z^{-2}}{1 + a_1' z^{-1} + a_2' z^{-2}} \quad (6)$$

The above equation may be organized into:

$$V(k) + a_1'V(k-1) + a_2'V(k-2) = b_0'I(k) + b_1'I(k-1) + b_2'I(k-2) \quad (7)$$

Then, the following two equations are constructed according to equation (7):

$$\begin{cases} a_1'V(k-1) + a_2'V(k-2) + V(k) = [I(k)\ I(k-1)\ I(k-2)][b_0'\ b_1'\ b_2']^T \\ b_0'I(k) + b_1'I(k-1) + b_2'I(k-2) - V(k) = [V(k-1)\ V(k-2)][a_1'\ a_2']^T \end{cases} \quad (8)$$

The steps of iterative identification described above are as follows:

Step 1: initializing the parameters $a'_1$ and $a'_2$, and $b'_0$, $b'_1$, and $b'_2$ in equation (8) are identified with a least square method. If one of $b'_0 > 0$, $b'_1 < 0$ and $b'_2 > 0$ does not meet the requirements, the corresponding $b'_i$ (i=0, 1, 2) is set to zero;

Step 2: substituting the known $b'_0$, $b'_1$ and $b'_2$ in the last step into the second equation of equation (8), and $a'_2$ and $a'_2$ are identified with the least square method.

If one of $a'_1 < 0$ and $a'_2 > 0$ do not meet the requirements, the corresponding $a'_i$ (i=1, 2) is set to zero;

Step 3: terminating the iteration process if all the parameters meet the requirements; otherwise, step 1 is performed again and N steps are iterated until the requirements are met; if the requirements are still not met after the N steps, the requirements are weakened and the iteration process are restarted. Finally, the identification result of the parameters obtained finally is $\hat{\theta} = [a'_1, a'_2, b'_0, b'_1, b'_2]$;

Step 4: $R_0$, $R_1$, $C_1$, $R_2$ and $C_2$ are solved according to the relationship between the above parameters and the model parameters.

Although the specific embodiments of the present invention are described above in combination with the accompanying drawing, the protection scope of the present invention is not limited thereto. It should be understood by those skilled in the art that various modifications or variations could be made by those skilled in the art based on the technical solution of the present invention without any creative effort, and these modifications or variations shall still fall into the protection scope of the present invention.

The invention claimed is:

1. A new method for iteratively identifying parameters of an equivalent circuit model of a battery, the method being performed by a matrix arithmetic processor, and the method comprising iteratively performing an identification process of performing steps comprising:

step (1): dividing the parameters of the equivalent circuit model into a first part and a second part;

step (2): setting initial values for the first part, and obtaining values of the second part with a least square method;

step (3): determining whether the obtained values of the second part meet requirements of the equivalent circuit model of the battery;

in response to the requirements not being met, the parameters that do not meet the requirements in the second part are set to zeros, so that all the parameters in the second part are known at this time, the parameters in the first part being identified with the least square method, and the method proceeds to step (4); and in response to the requirements being met, the parameters in the first part are directly identified with the least square method, and the method proceeds to step (4);

step (4): determining whether the obtained values of the first part meet the requirements of the equivalent circuit model of the battery;

in response to the requirements not being met, the parameters that do not meet the requirements in the first part are set to zeros, and the method proceeds to step (5); and in response to the requirements being met, the method proceeds to step (5); and step (5): terminating the iterative identification process when the parameters in the first part and the second part meet the requirements such that one or more states of the battery of a vehicle are determined in real time, and returning to step (2) when the parameters in the first part and the second part do not meet the requirements.

2. The new method for iteratively identifying parameters of the equivalent circuit model of the battery according to claim 1, wherein a process equation of the equivalent circuit model of the battery is:

$$y = \psi\theta + n$$

where y is a system output of the equivalent circuit model of battery, $\psi$ is an input data matrix, $\theta$ is a to-be-identified parameter vector, and n is interference noise; and the parameter vector $\theta$ is divided into first and second parts as parameters $\theta_1$ and $\theta_2$.

3. The new method for iteratively identifying parameters of the equivalent circuit model of the battery according to claim 2, wherein the parameter $\theta_1$ is initialized to $\theta_{10}$, and the parameter $\theta_2$ is identified by the least square method as:

$$\theta_2 = (\psi^T\psi)^{-1}\psi^T(y - \psi\theta_{10}).$$

4. The new method for iteratively identifying parameters of the equivalent circuit model of the battery according to claim 2, wherein the parameter $\theta_1$ in the first part is identified by the least square method as follows:

$$\theta_1 = (\psi^T\psi)^{-1}\psi^T(y - \psi\theta_2).$$

5. The new method for iteratively identifying parameters of the equivalent circuit model of the battery according to claim 1, wherein parameters related to a voltage of the battery are classified as one of the first or second part, and parameters related to a current of the battery are classified as the other one of the first or second part.

* * * * *